US009627480B2

(12) United States Patent
Chou et al.

(10) Patent No.: US 9,627,480 B2
(45) Date of Patent: Apr. 18, 2017

(54) JUNCTION BUTTING STRUCTURE USING NONUNIFORM TRENCH SHAPE

(71) Applicant: GLOBALFOUNDRIES INC., Grand Cayman, KY (US)

(72) Inventors: Anthony I. Chou, Beacon, NY (US); Judson R. Holt, Wappingers Falls, NY (US); Arvind Kumar, Beacon, NY (US); Henry K. Utomo, Newburgh, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 222 days.

(21) Appl. No.: 14/315,385

(22) Filed: Jun. 26, 2014

(65) Prior Publication Data
US 2015/0380488 A1    Dec. 31, 2015

(51) Int. Cl.
*H01L 29/66* (2006.01)
*H01L 29/08* (2006.01)
*H01L 29/786* (2006.01)
*H01L 29/78* (2006.01)
*H01L 29/165* (2006.01)

(52) U.S. Cl.
CPC ........ *H01L 29/0847* (2013.01); *H01L 29/165* (2013.01); *H01L 29/6653* (2013.01); *H01L 29/66636* (2013.01); *H01L 29/66742* (2013.01); *H01L 29/78* (2013.01); *H01L 29/786* (2013.01)

(58) Field of Classification Search
CPC ........... H01L 29/66636; H01L 27/1203; H01L 21/26586; H01L 21/76237; H01L 21/823814; H01L 29/78618
See application file for complete search history.

(56) References Cited

U.S. PATENT DOCUMENTS

| 6,372,564 | B1  | 4/2002 | Lee |
| 6,724,049 | B2* | 4/2004 | Fujiwara ............... H01L 29/458 257/349 |
| 6,849,519 | B2  | 2/2005 | Dong |
| 7,385,258 | B2* | 6/2008 | Zhu ................... H01L 21/76816 257/382 |
| 7,569,434 | B2* | 8/2009 | Cheng .................. H01L 29/165 257/E21.409 |
| 7,781,278 | B2  | 8/2010 | Zhu |
| 7,960,229 | B2  | 6/2011 | Yang et al. |
| 7,989,298 | B1* | 8/2011 | Chan .................... H01L 29/165 257/E21.409 |
| 7,994,014 | B2* | 8/2011 | Yang ................. H01L 21/02433 257/E21.619 |

(Continued)

FOREIGN PATENT DOCUMENTS

JP    4122649 B2    7/2008

*Primary Examiner* — Bac Au
(74) *Attorney, Agent, or Firm* — Yuanmin Cai; Hoffman Warnick LLC

(57) ABSTRACT

The present invention relates generally to semiconductor devices and more particularly, to a structure and method of forming a partially depleted semiconductor-on-insulator (SOI) junction isolation structure using a nonuniform trench shape formed by reactive ion etching (RIE) and crystallographic wet etching. The nonuniform trench shape may reduce back channel leakage by providing an effective channel directly below a gate stack having a width that is less than a width of an effective back channel directly above the isolation layer.

11 Claims, 15 Drawing Sheets

(56) References Cited

U.S. PATENT DOCUMENTS

| | | | |
|---|---|---|---|
| 8,207,033 B2* | 6/2012 | Kim | H01L 29/7848 438/245 |
| 8,236,632 B2 | 8/2012 | Fried et al. | |
| 8,373,259 B2 | 2/2013 | Kim et al. | |
| 8,377,784 B2* | 2/2013 | Cheng | H01L 21/02532 134/4 |
| 8,394,712 B2* | 3/2013 | Dube | H01L 29/66628 257/77 |
| 8,426,284 B2* | 4/2013 | Yeh | H01L 21/30608 257/E21.221 |
| 8,450,167 B2* | 5/2013 | He | H01L 29/165 438/198 |
| 8,524,566 B2* | 9/2013 | Flachowsky | H01L 21/84 257/204 |
| 8,558,289 B2* | 10/2013 | Cheng | H01L 29/165 257/255 |
| 8,574,995 B2* | 11/2013 | Jeng | H01L 21/823431 438/305 |
| 8,659,089 B2* | 2/2014 | Ko | H01L 29/66636 257/368 |
| 8,728,896 B2* | 5/2014 | Kronholz | H01L 21/823412 438/14 |
| 9,024,368 B1* | 5/2015 | Yu | H01L 29/66795 257/288 |
| 9,029,912 B2* | 5/2015 | Lee | H01L 29/78 257/192 |
| 9,105,654 B2* | 8/2015 | Ma | H01L 29/66636 |
| 9,117,925 B2* | 8/2015 | Liang | H01L 21/823418 |
| 2007/0004123 A1* | 1/2007 | Bohr | H01L 21/30608 438/230 |
| 2008/0057710 A1* | 3/2008 | Zhu | H01L 29/045 438/682 |
| 2009/0101942 A1* | 4/2009 | Dyer | H01L 21/30608 257/288 |
| 2009/0152590 A1* | 6/2009 | Adam | H01L 29/165 257/192 |
| 2009/0294860 A1* | 12/2009 | Mowry | H01L 21/823807 257/368 |
| 2011/0049567 A1* | 3/2011 | Peng | H01L 21/30608 257/190 |
| 2012/0091469 A1* | 4/2012 | Park | H01L 29/0847 257/77 |
| 2012/0112280 A1 | 5/2012 | Johnson et al. | |
| 2012/0168864 A1 | 7/2012 | Dennard et al. | |
| 2012/0187490 A1 | 7/2012 | Fried et al. | |
| 2012/0241815 A1* | 9/2012 | Kim | H01L 21/0243 257/190 |
| 2012/0261672 A1 | 10/2012 | Chidambarrao et al. | |
| 2013/0207166 A1* | 8/2013 | Chen | H01L 21/02532 257/288 |
| 2014/0138745 A1* | 5/2014 | Shin | H01L 29/4966 257/192 |
| 2014/0246710 A1* | 9/2014 | Tsai | H01L 29/7848 257/288 |
| 2014/0264558 A1* | 9/2014 | Chandra | H01L 29/36 257/329 |
| 2015/0372142 A1* | 12/2015 | Kuang | H01L 29/7848 257/192 |

* cited by examiner

JUNCTION BUTTING STRUCTURE USING NONUNIFORM TRENCH SHAPE

BACKGROUND

The present invention relates generally to semiconductor devices and more particularly, to a structure and method of forming a butted semiconductor-on-insulator (SOI) junction butting structure using a nonuniform trench shape.

Integrated circuits fabricated in partially-depleted semiconductor on insulator (SOI) technology rely on adjacent field effect transistors (FETs) which share the same active region being electrically isolated from each other. However, when coupled with the need for decreasing the size of the FETs, such as, for example, in very-large-scale integration (VLSI) technologies like high density microprocessor or memory technologies, the very nature of the isolation can create undesired effects in the FETs such as back channel leakage and short channel effects.

SUMMARY

According to an embodiment, a method of forming a junction butting structure is disclosed. The method may include: forming a nonuniform trench in a silicon on insulator (SOI) layer between a first gate stack and a second gate stack, the nonuniform trench having a tapered bottom that is adjacent to an underlying isolation layer, such that an effective channel directly below the first gate stack has width that is less than a width of an effective back channel directly above the isolation layer; and forming a source-drain region in the nonuniform trench by growing a doped epitaxial material.

According to another embodiment, a junction butting structure is disclosed. The structure may include: a source-drain region in a silicon on insulator (SOI) layer between a first gate stack and a second gate stack, the source-drain region having an upper portion and having a tapered bottom portion that is adjacent to an underlying isolation layer, such that an effective channel directly below the first gate stack has width that is less than a width of an effective back channel directly above the isolation layer.

According to another embodiment, a junction butting structure is disclosed. The structure may include: a source-drain region in a silicon on insulator (SOI) layer between a first gate stack and a second gate stack, the source-drain region having angled sidewalls and having a flat bottom portion that is adjacent to an underlying isolation layer, such that an effective channel directly below the first gate stack has width that is less than a width of an effective back channel directly above the isolation layer; and a buffer layer located between the source-drain region and the SOI layer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
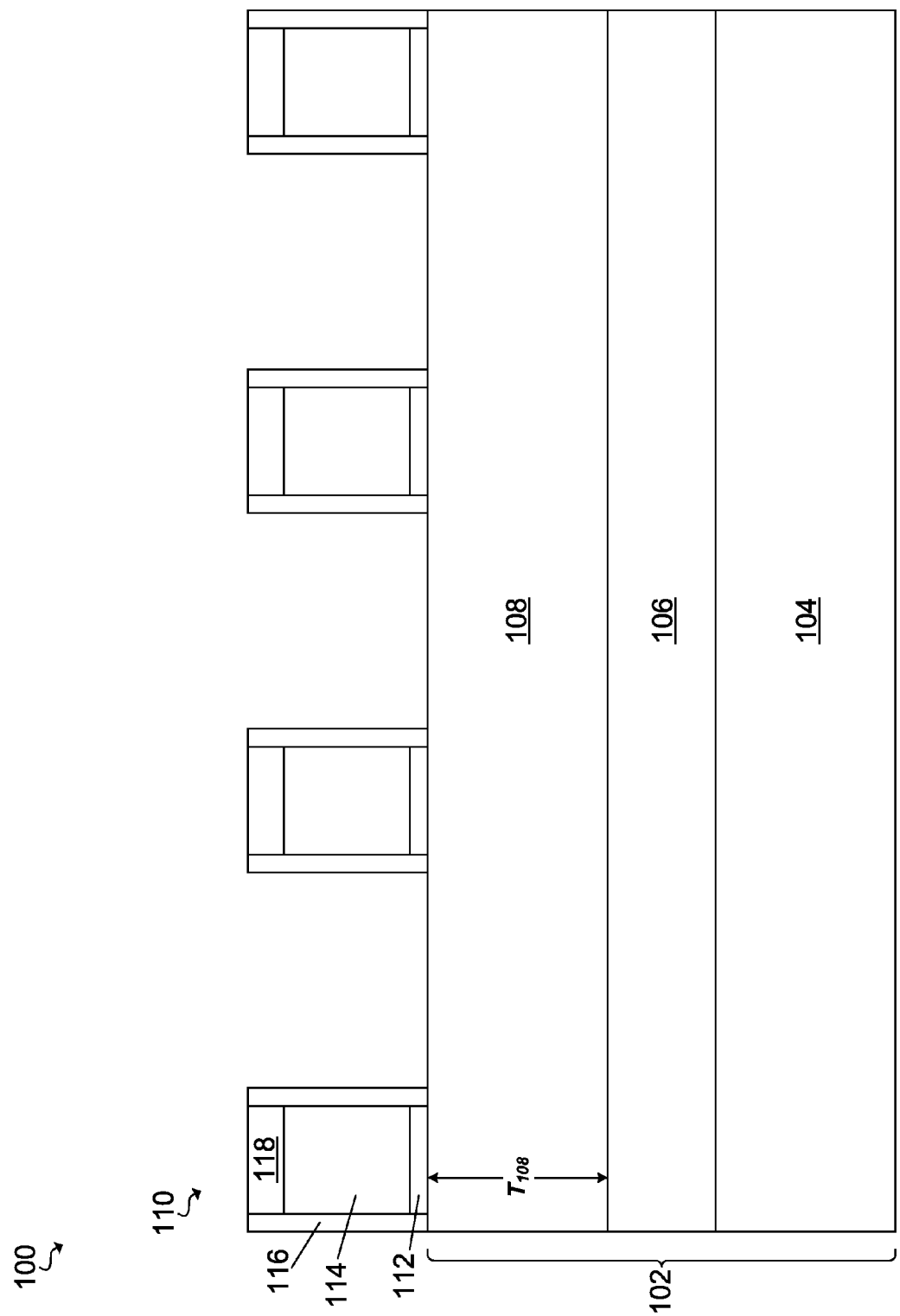
FIG. 1 is a cross section view illustrating a structure, according an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to semiconductor devices and more particularly, to a structure and method of forming a partially depleted semiconductor-on-insulator (SOI) junction isolation structure using a nonuniform trench shape formed by reactive ion etching (RIE) and crystallographic wet etching. The junction butting structure may be used to reduce back channel leakage, short channel effects, parasitic junction capacitance and under-junction leakage between adjacent FETs in high performance microprocessor technologies or high density memory technologies, such as dynamic random access memory (DRAM) devices and embedded DRAM (eDRAM) devices.

An SOI substrate may include an amorphous buried oxide ("BOX") layer (i.e., isolation layer) between an upper silicon on insulator ("SOI") layer and a supporting silicon substrate which may also be single-crystal silicon. The BOX layer may be composed of, for example, silicon oxide (SiO2). When, for example, a n-channel FET (NFET) is fabricated adjacent to a p-channel FET (PFET), in SOI technology, the adjacent devices (for example, NFET, PFET) may be electrically isolated from each other by shallow trench isolation (trenches filled with a dielectric material such as silicon oxide that extend from the top surface of the upper silicon layer in which the devices are fabricated down to the BOX layer of the SOI substrate. The shallow trench isolation prevents body-to-body and other forms of leakage between the adjacent devices which are in separate active regions.

When a PFET is fabricated adjacent to another PFET (or an NFET is fabricated adjacent to another NFET) within a shared active region, the adjacent devices may be electrically isolated from each other by their source-drain regions (S-D regions) which may extend from the top surface of the upper silicon layer in which the devices are fabricated down to the BOX layer. The S-D regions themselves may abut the BOX layer (i.e., a hard butted SOI junction isolation), or a depletion region of the S-D region may abut the BOX layer (i.e., a soft butted SOI junction isolation) to prevent body-to-body leakage between the adjacent devices. The hard or soft butted SOI junction isolation is usually is achieved by deep S-D implantation using high energy ion implantation, for example 5 keV to 50 keV, or more depending on different species and the thickness of the SOI layer. Using these techniques, adjacent devices may share a common S-D region that is relied upon for device isolation. This may allow for a significant decrease in the silicon area required for each device, thereby increasing device density.

However, when a butted SOI junction isolation is used in devices where the FET channel length is of the same order of magnitude as the depletion-layer widths of the source and drain junctions, short-channel effects become a significant problem. The channel length is the distance between two S-D regions on either side of the gate of an FET measured parallel to the top surface of the upper silicon layer. The depletion widths are measured under the gate in the same direction as the channel length. Short-channel effects may include drain-induced barrier lowering and punch through, the lowering of the threshold voltage (Vt) due to the shortened channel length, and an increase in off-state channel leakage ($T_{off}$). Off-state channel leakage may be a concern because leakage increases chip power dissipation in power sensitive applications, and also reduces eDRAM or DRAM retention time in memory applications. The short channel effect in butted SOI junction isolation devices may be further exaggerated by lateral scattering of the deep ion implantations normally used to form a junction butting region of the S-D region underneath the gate.

A further drawback to forming a SOI butted junction by ion implantation is that when the S-D region touches or nearly touches the BOX layer, a parasitic back channel FET may be formed. In a back channel FET, the BOX layer may serve as a gate dielectric, and the substrate may serve as a gate electrode of the parasitic back channel FET. This may increase S-D region leakage by providing an alternate path for parasitic leakage current to flow, through the interface of SOI layer and the BOX layer. This parasitic leakage current conduction at the bottom of the SOI layer is known as back channel leakage. When ion implantation is used to form the S-D region, the effective gate length of the parasitic back channel FET may be similar to the effective gate length of the front channel device since the S-D dopants are typically implanted vertically. Accordingly, if the front channel gate length is reduced for performance reasons, the parasitic back channel device gate length may also be reduced and parasitic leakage may be increased.

One way to reduce the short-channel effects and back-channel leakage, while ensuring proper junction butting may be to forgo ion implantation altogether, and utilize the geometry of a S-D trench itself to achieve proper junction butting. In particular, proper junction butting may be achieve by forming a S-D trench, using specific etching techniques, having a non-uniform profile with a tapered bottom that may reduce body-to-body leakage and back channel leakage. Embodiments by which to form a non-uniform trench for junction butting are described below in detail with reference to FIGS. 1-9B.

Referring now to FIG. 1, a cross section view of a structure 100 is shown. The structure 100 may be an FET device having a plurality of gate stacks 110 (hereinafter "gate stacks") formed on a SOI substrate 102. The SOI substrate 102 may include an SOI layer 108 separated from a substrate layer 104 by an isolation layer 106. The isolation layer 106 may composed of dielectric material, such as, for example, silicon dioxide. In an embodiment, the SOI layer 108 may be composed of single-crystal silicon. If the structure 100 is a PFET, the SOI layer 108 may be undoped or lightly doped with n-type dopants, such as for example, phosphorus and arsenic, at a concentration ranging from approximately 1E16 atm/cm$^3$ to approximately 1E19 atm/cm$^3$. If the structure 100 is a NFET, the SOI layer 108 may be an undoped or lightly doped with p-type dopants, such as for example, boron, at a concentration ranging from approximately 1E16 atm/cm$^3$ to approximately 1E19 atm/cm$^3$. In an embodiment, the SOI layer 108 is intrinsic (i.e., completely undoped). The SOI layer 108 may have a thickness $T_{108}$ ranging from approximately 20 nm to approximately 300 nm, preferably from approximately 50 nm to approximately 100 nm.

The substrate layer 104 may be a doped crystalline semiconductor material, a doped polycrystalline semiconductor material, or an amorphous semiconductor material and subsequently annealed to convert to a doped polycrystalline semiconductor material. The doped semiconductor material may be formed with in-situ doping or implantation. The doped semiconductor material may be selected from doped crystalline silicon, polysilicon, doped polycrystalline germanium, a doped silicon-germanium polycrystalline alloy, a doped silicon carbon polycrystalline alloy, a doped silicon-germanium-carbon polycrystalline alloy, doped polycrystalline gallium arsenide, doped polycrystalline indium arsenide, doped polycrystalline indium phosphide, doped polycrystalline III-V compound semiconductor materials, doped polycrystalline II-VI compound semiconductor materials, doped polycrystalline organic semiconductor materials, and other doped polycrystalline compound semiconductor materials. The thickness of the semiconductor substrate layer 104 may range from approximately 50 microns to approximately 1000 microns, although lesser and greater thicknesses can also be employed. The substrate layer 104 may be doped with n-type dopants or p-type dopants. The dopant concentration of the substrate layer 104 may range from approximately 5.0E18 atm/cm$^3$ to approximately 3.0E21 atm/cm$^3$, although lesser and greater dopant concentrations can also be employed.

Each of the gate stacks 110 may include a gate dielectric layer 112 on the SOI layer 108 and a gate electrode 114 formed on the gate dielectric layer 112. A gate spacer 116 may be formed on opposite sidewalls of the gate dielectric layer 112 and gate electrode 114, and on an upper surface of the gate electrode 114. In an embodiment, the gate electrode 114 may be composed of a doped or undoped polysilicon, a metal, or combinations of layers thereof. In an embodiment, the gate dielectric layer 112 may be composed of $SiO_2$, silicon nitride ($Si_3N_4$) or combinations thereof. In one example, the gate dielectric layer 112 may be composed of a high K (dielectric constant) material, examples of which include, but are not limited to, metal oxides such as $Ta_2O_5$, $BaTiO_3$, $HfO_2$, $ZrO_2$, $Al_2O_3$, metal silicates such as $HfSi_xO_y$, or $HfSi_xO_yN_z$ and combinations of layers thereof. A high K dielectric material may have a relative permittivity above about 10. In one example, the gate dielectric layer 112 may have a thickness ranging from approximately 0.5 nm to approximately 5 nm thick, preferably from approximately 1 nm to approximately 3 nm.

The gate spacer 116 may be composed of an insulator material, such as, for example, a silicon nitride. The gate spacer 116 may be formed by depositing the insulator material using well known methods of deposition such as, for example, chemical vapor deposition (CVD), plasma-enhanced CVD (PECVD), metal organic chemical vapor deposition (MOCVD), atomic layer deposition (ALD), evaporation, reactive sputtering, chemical solution deposition, and other like processes. After deposition, the insulator material may undergo a conventional etching process such as, but not limited to reactive ion etching (RIE) or anisotropic etching to remove portions of the insulator material from horizontal surfaces of the SOI layer 108 and the gate stacks 110 to form the gate spacer 116. In one embodiment, the gate spacer 116 may have a width of approximately 2 nm to approximately 20 nm. A gate cap 118 may then be formed on the top of the gate stacks 110. The gate cap 118 may be formed using any conventional deposition process, such as those listed above. In an embodiment, the gate cap 118 may be composed of the same material as the gate spacer 116. In another embodiment, the gate cap 118 may be composed of a hard mask material.

Figure 2:
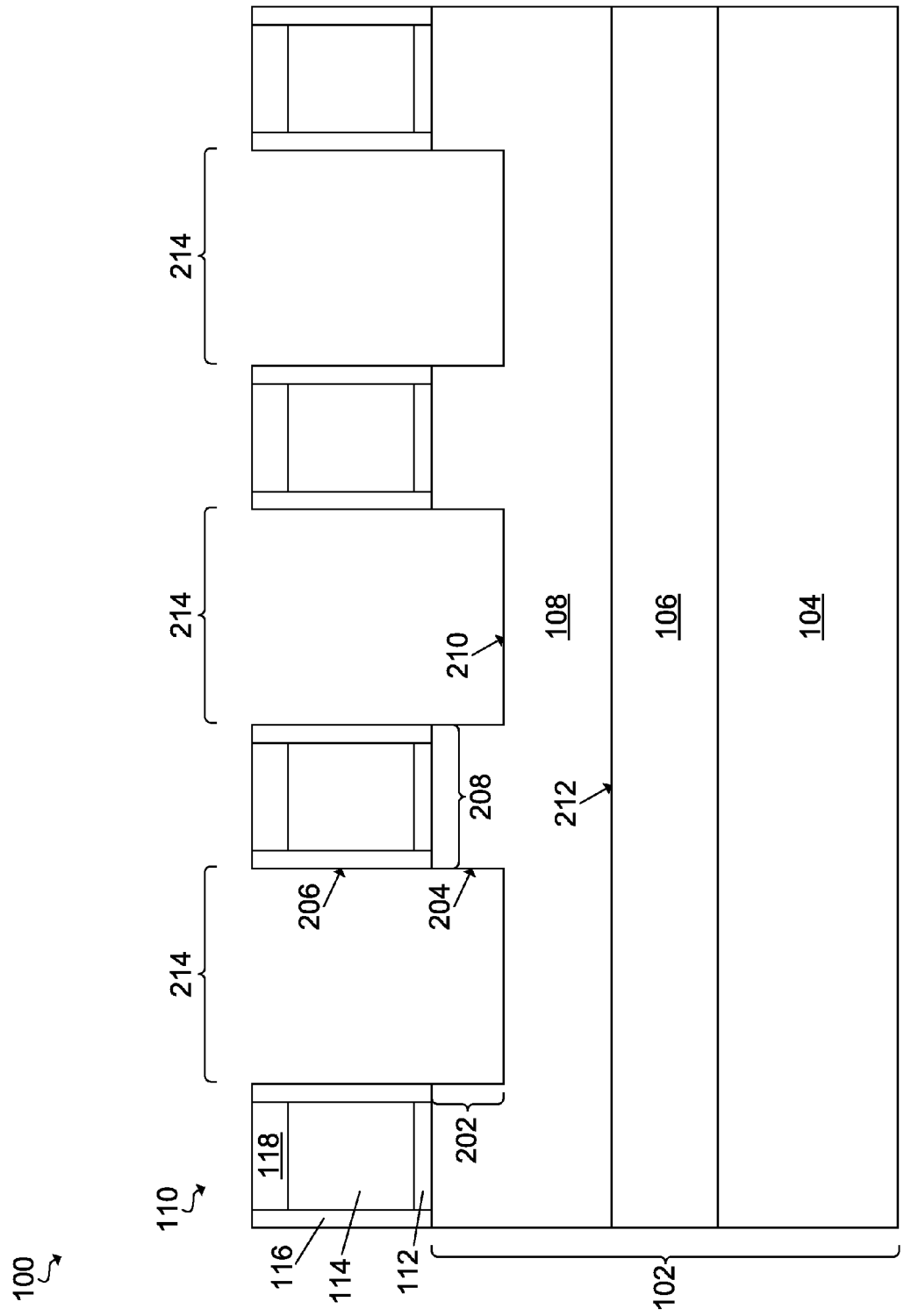
FIG. 2 is a cross section view illustrating forming an upper portion of a nonuniform trench in the structure, according an embodiment of the present invention.

Referring now to FIG. 2, a cross section view illustrating forming an upper portion 202 of a nonuniform trench 214 in the SOI layer 108 between adjacent gate stacks 110 is shown. In an embodiment, the upper portion 202 may be formed by anisotropically etching the SOI layer 108 using a conventional etching process, such as, for example, reactive ion etching (RIE). In an embodiment, a bottom 210 of the upper portion 202 may remain substantially horizontal (i.e., substantially parallel with an upper surface 212 of the isolation layer 106). The gate spacer 116 may serve as an etch stop or mask, preventing portions of the SOI layer 108 below the gate spacer 116 and the gate stack 110 from being removed. Accordingly, the upper portion 202 may have a pair of sidewalls 204 (hereinafter "sidewalls") that are substantially flush with a sidewall 206 of the gate spacers 116. It should be noted that this etching technique may provide for a larger effective channel 208 (i.e., the width of the SOI layer 108 directly below the gate stack 110 and between a source region and a drain region) than conventional junction butting fabrication techniques.

Figure 3:
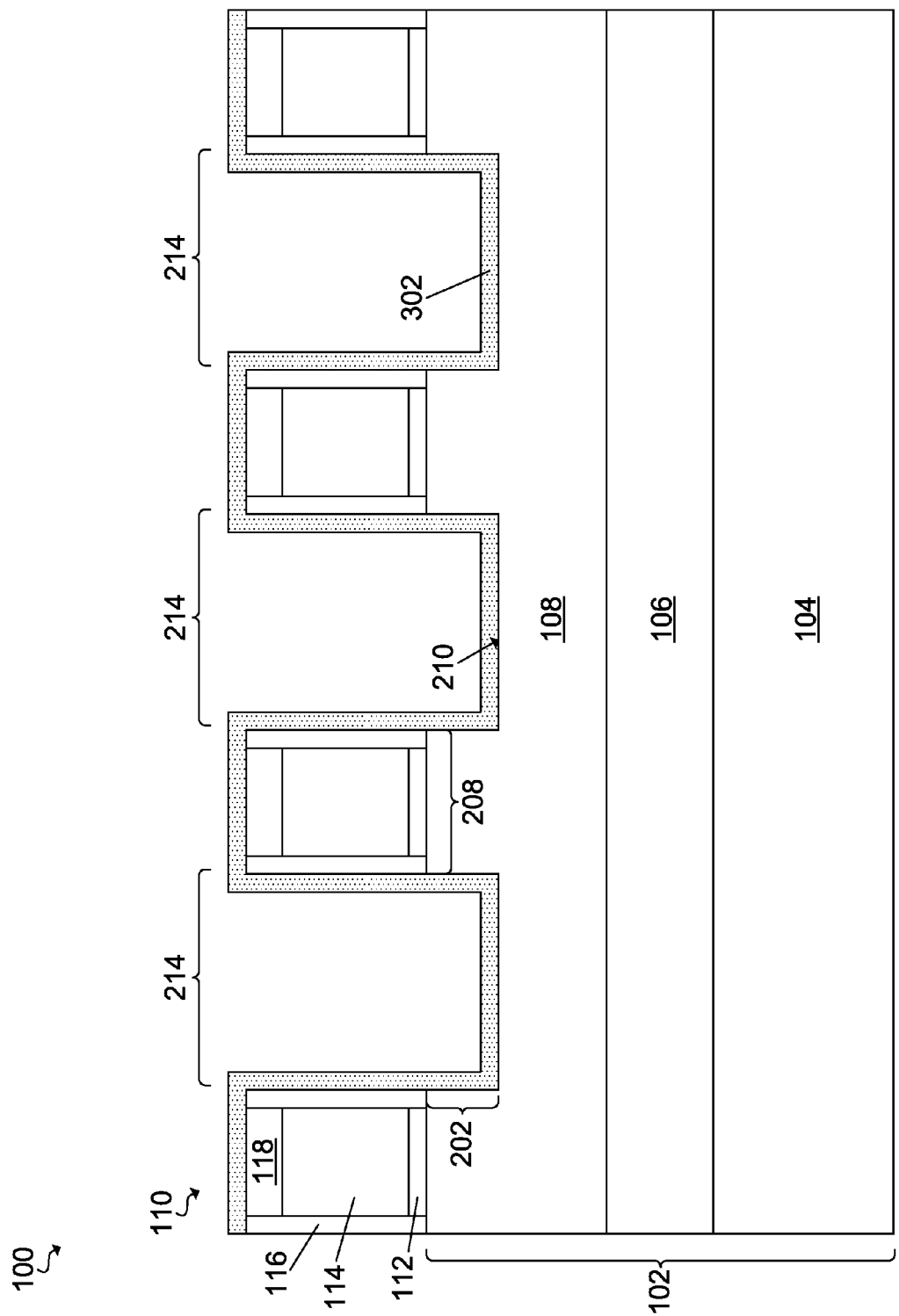
FIG. 3 is a cross section view illustrating forming a first trench liner in the upper portion and on a gate spacer, according an embodiment of the present invention.

Referring now to FIG. 3, a cross section view illustrating forming a first trench liner 302 in the upper portion 202 and on the gate spacer 116. The first trench liner 302 may be deposited by a conventional conformal deposition process, such as, for example, CVD, PECVD, MOCVD, ALD, evaporation, reactive sputtering, chemical solution deposition, and other like processes. The first trench liner 302 may be composed of an insulator material, such as, for example, a dielectric. In an embodiment, the first trench liner 302 may be composed of an oxide, such as, for example, $SiO_2$. The first trench liner 302 may protect the gate spacer 116 and gate cap 118 from subsequent etching and removal steps described in detail below. The first trench liner 302 may have a thickness ranging from approximately 2 nm to approximately 20 nm.

Figure 4:
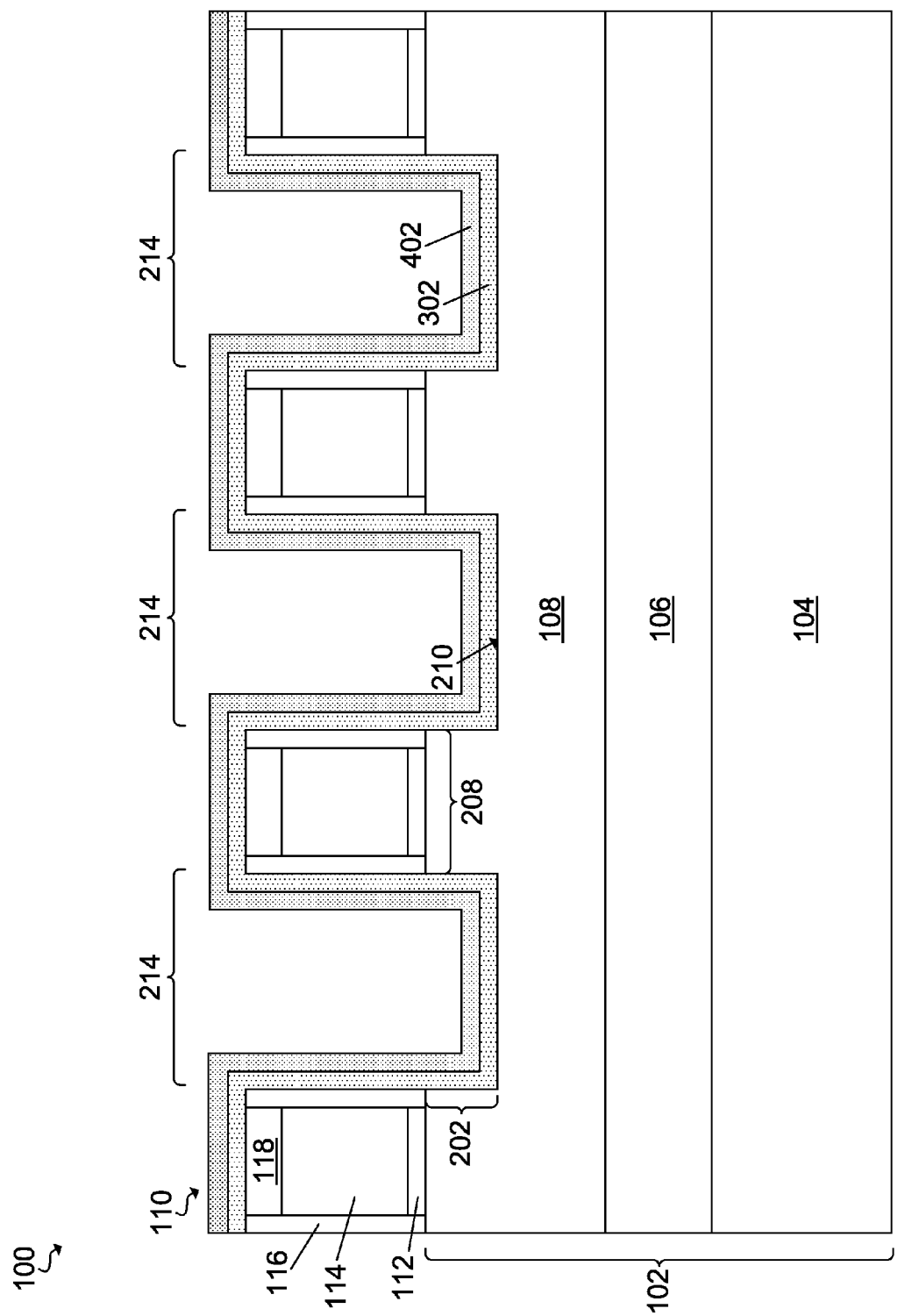
FIG. 4 is a cross section view illustrating forming a second trench liner on the first trench liner, according an embodiment of the present invention.

Referring now to FIG. 4, a cross section view illustrating forming a second trench liner 402 on the first trench liner 302 is shown. The second trench liner 402 may be deposited by a conventional conformal deposition process, such as, for example, CVD, PECVD, MOCVD, ALD, evaporation, reactive sputtering, chemical solution deposition, and other like processes. The second trench liner 402 may be composed of an insulator material, such as, for example, a dielectric. In an embodiment, the second trench liner 402 may be composed of a nitride, such as, for example, $Si_3N_4$. The second trench liner 402 may have a thickness ranging from approximately 2 nm to approximately 20 nm.

Figure 5:
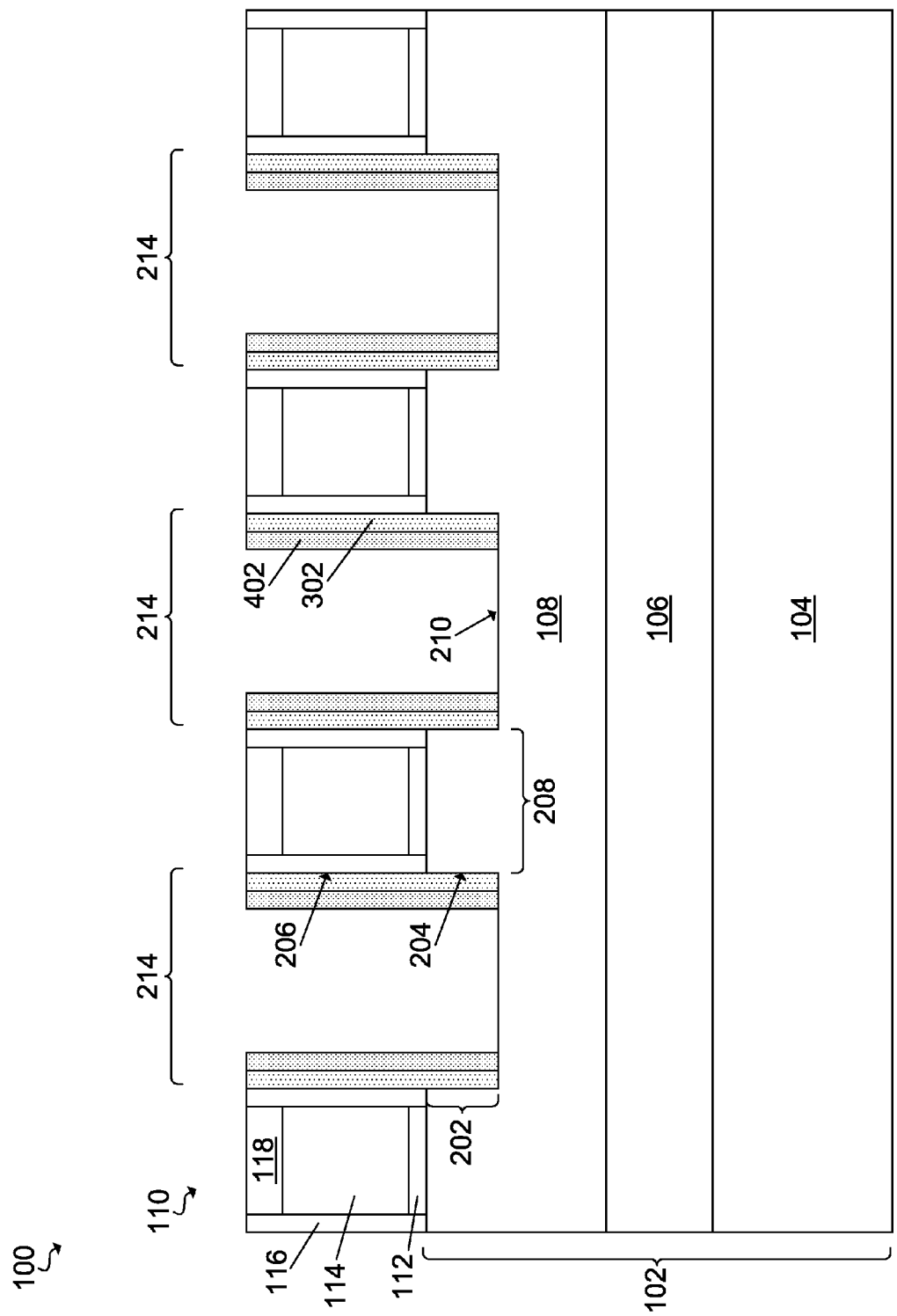
FIG. 5 is a cross section view illustrating removing a portion of the first trench liner and a portion of the second trench liner, according an embodiment of the present invention.

Referring now to FIG. 5, a cross section view illustrating removing a portion of the first trench liner 302 and a portion of the second trench liner 402 is shown. The portion of the first trench liner 302 and the portion of the second trench liner 402 may be removed from the bottom 210 of the upper portion 202 and removed from the gate cap 118. In an embodiment, the portion of the first trench liner 302 and the portion of the second trench liner 402 may be removed using a conventional anisotropic etching process, such as, for example, RIE. After the removal process, the first trench liner 302 and the second trench liner 402 may remain only along the sidewall 204 of the upper portion 202 and along the sidewall 206 of the gate spacer 116. Accordingly, the removal process may expose the bottom 210 of the upper portion 202.

Figure 6:
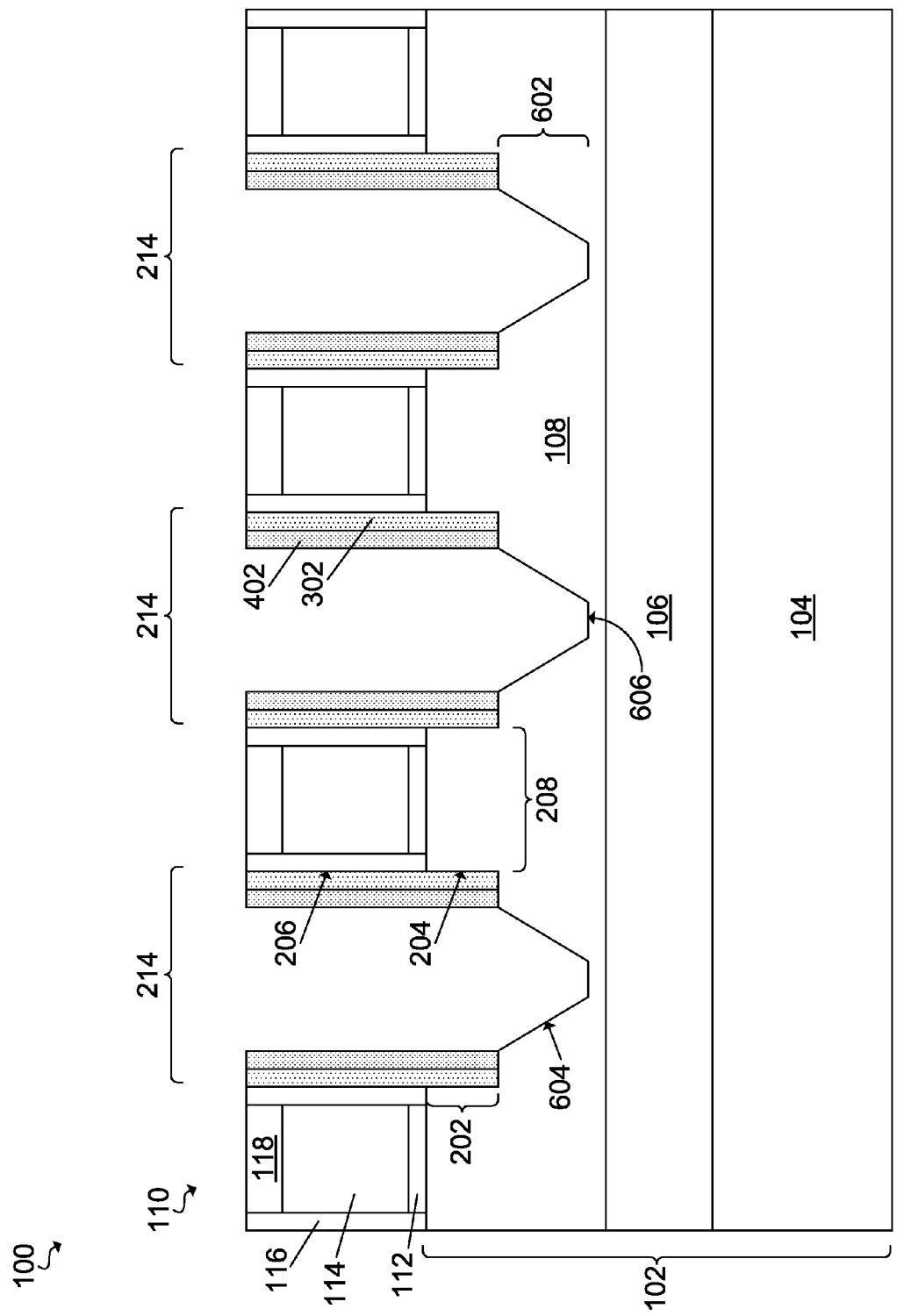
FIG. 6 is a cross section view illustrating forming a bottom portion of the nonuniform trench, according an embodiment of the present invention.

Referring now to FIG. 6, a cross section view illustrating forming a bottom portion 602 of the nonuniform trench 214 in the SOI layer 108 is shown. The bottom portion 602 may be formed by etching the SOI layer 108 exposed at the bottom 210 (FIG. 5) of the upper portion 202 (FIG. 5) using a conventional anisotropic wet etching technique. The etchant may be chosen for its selectivity to the gate spacer 116, the first trench liner 302, and the second trench liner 402. In an embodiment, the etchant may be ammonium hydroxide (NH$_4$OH). The etchant may etch the SOI layer 108 along the 1:1:1 crystallographic plane, thereby producing angled sidewalls 604.

In an embodiment, the etching process may be timed so that the bottom portion 602 has a horizontal bottom 606 adjacent to the isolation layer 106. The horizontal bottom 606 may be separated from the isolation layer 106 by a portion of the SOI layer 108. This may be preferred in an embodiment in which the lateral spacing between gate stacks 110 is not uniform so that the bottom portion 602 may be etched without substantially contacting the isolation layer 106.

Figure 7:
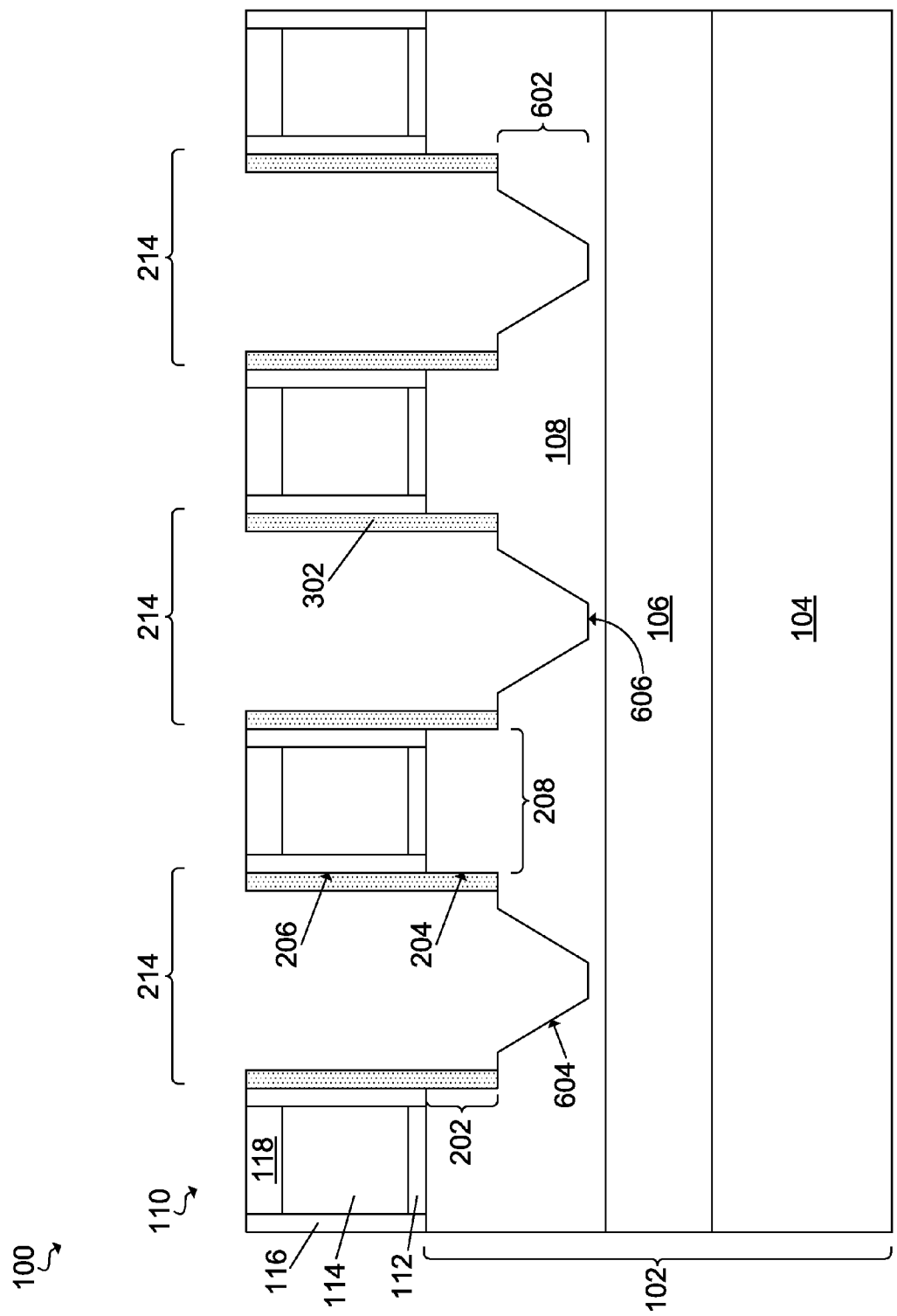
FIG. 7 is a cross section view illustrating removing the second trench liner, according an embodiment of the present invention.

Referring now to FIG. 7, a cross section view illustrating removing the second trench liner 402 (FIG. 6) is shown. In an embodiment, the second trench liner 402 may be removed using a conventional etching technique that is selective to the SOI layer 108, the first trench liner 302, and the gate spacer 116 such as, for example, a wet etch using hot phosphoric acid.

Figure 8:
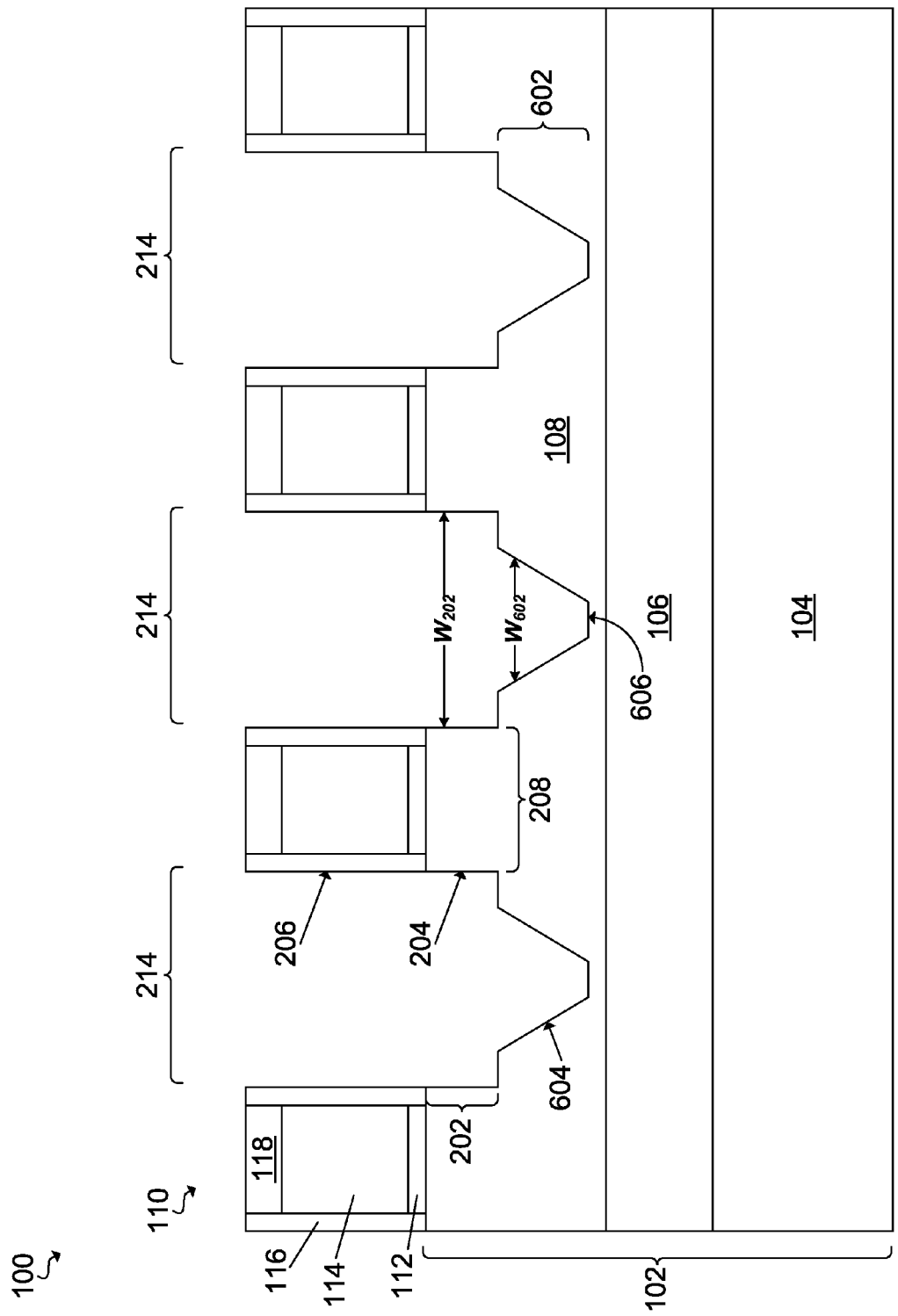
FIG. 8 is a cross section view illustrating removing the first trench liner, according an embodiment of the present invention.

Referring now to FIG. 8, a cross section view illustrating removing the first trench liner 302 (FIG. 7) is shown. In an embodiment, the first trench liner 302 may be removed using a conventional etching technique that is selective to the SOI layer 108, and the gate spacer 116 such as, for example, a wet etch containing hydrofluoric acid. In an embodiment in which the first trench liner 302 is composed of an oxide, it may be removed as part of a pre-epitaxial clean of the nonuniform trench 214 selective to the gate spacer 116 and gate cap 118, using a wet etch containing hydrofluoric acid. The removal of the first trench liner 302 may expose the entire upper portion 202 of the nonuniform trench 214. The upper portion 202 may have substantially rectangular shape, and may have a total width W$_{202}$ that is larger than a total width W$_{602}$ of the bottom portion.

Figure 9A:
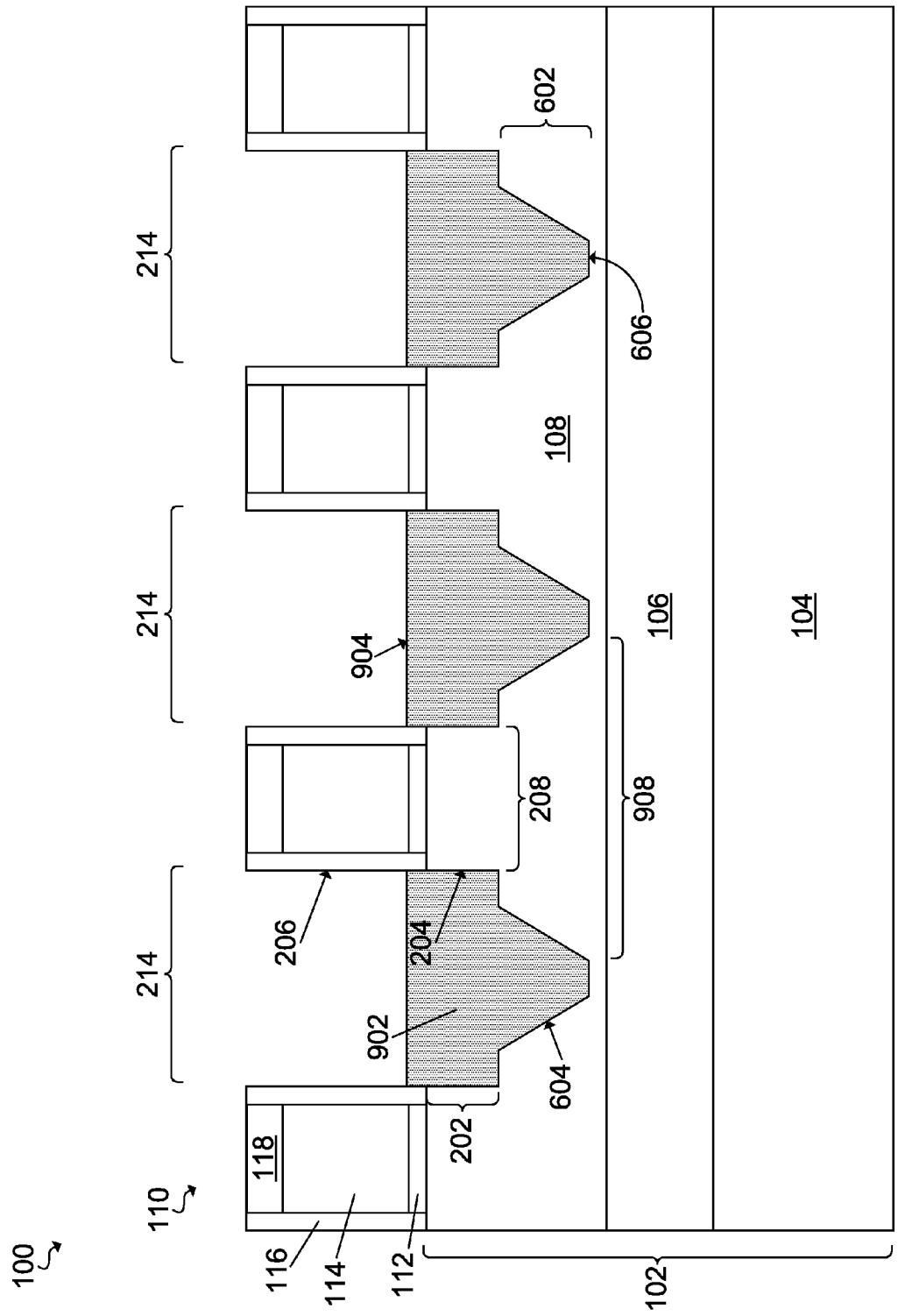
FIG. 9A is a cross section view forming a source-drain region having a substantially flat bottom in the nonuniform trench, according an embodiment of the present invention.

Referring now to FIG. 9A, a cross section view illustrating forming a source-drain region 902 (hereinafter "S-D region") in the nonuniform trench 214 is shown. The S-D region 902 may be formed by growing a doped semiconductor material in the nonuniform trench 214 using any conventional epitaxial growth and doping process. The doped epitaxial material may be formed using in-situ doping. In an embodiment, the doped epitaxial material may be formed such that an upper surface 904 of the S-D region 902 extends above an upper surface of the SOI layer 108. In another embodiment, the upper surface 904 of the S-D region 902 may be substantially flush with the upper surface of the SOI layer 108.

The doped epitaxial material may be formed in layers, such that different layers may have different dopant concentrations. In an embodiment, the dopant concentration may be graded such that a bottom portion and side portions of the S-D region 902 are lightly doped while the center of the S-D region 902 is more highly doped. This concentration gradient may provide a well-graded junction profile to reduce junction leakage. In an embodiment in which the structure 100 is an NFET, the doped epitaxial material may be composed of, for example, silicon carbide (SiC) with n-type dopants such as, for example phosphorus or arsenic doping.

In an embodiment in which the structure 100 is a PFET, the epitaxial material could be silicon germanium (SiGe) doped with p-type dopants, such as, for example, boron or boron difluoride.

After the doped epitaxial material is deposited, the semiconductor structure 100 may be annealed to activate the dopant atoms in the doped epitaxial material and to complete the formation of the S-D region 902. In an embodiment, the annealing process may include subjecting the structure 100 to an elevated temperature, ranging from approximately 800° C. to approximately 1250° C., for approximately 1 ms to approximately 500 ms. In an embodiment, the annealing process may be a rapid thermal anneal (RTA). In another embodiment, the annealing process may be a millisecond anneal such as a laser spike anneal or a flash lamp anneal. During annealing, the individual layers of the doped epitaxial material may become comingled as one layer with a graded dopant concentration (i.e., dose activation) as discussed above. The S-D region 902 may have a tapered bottom portion in close proximity to, or physically contacting, the isolation layer 106 that serves as a junction butting region to reduce body-to-body leakage between adjacent FETs. In an embodiment, parasitic back channel leakage into the base substrate 104 may be reduced because the length of an effective parasitic back channel 908 may be greater than the length of the effective channel 208. In addition, because of the shape of the S-D regions 902, the length of the effective parasitic back channel 908 may be greater than a conventional back channel length.

Figure 9B:
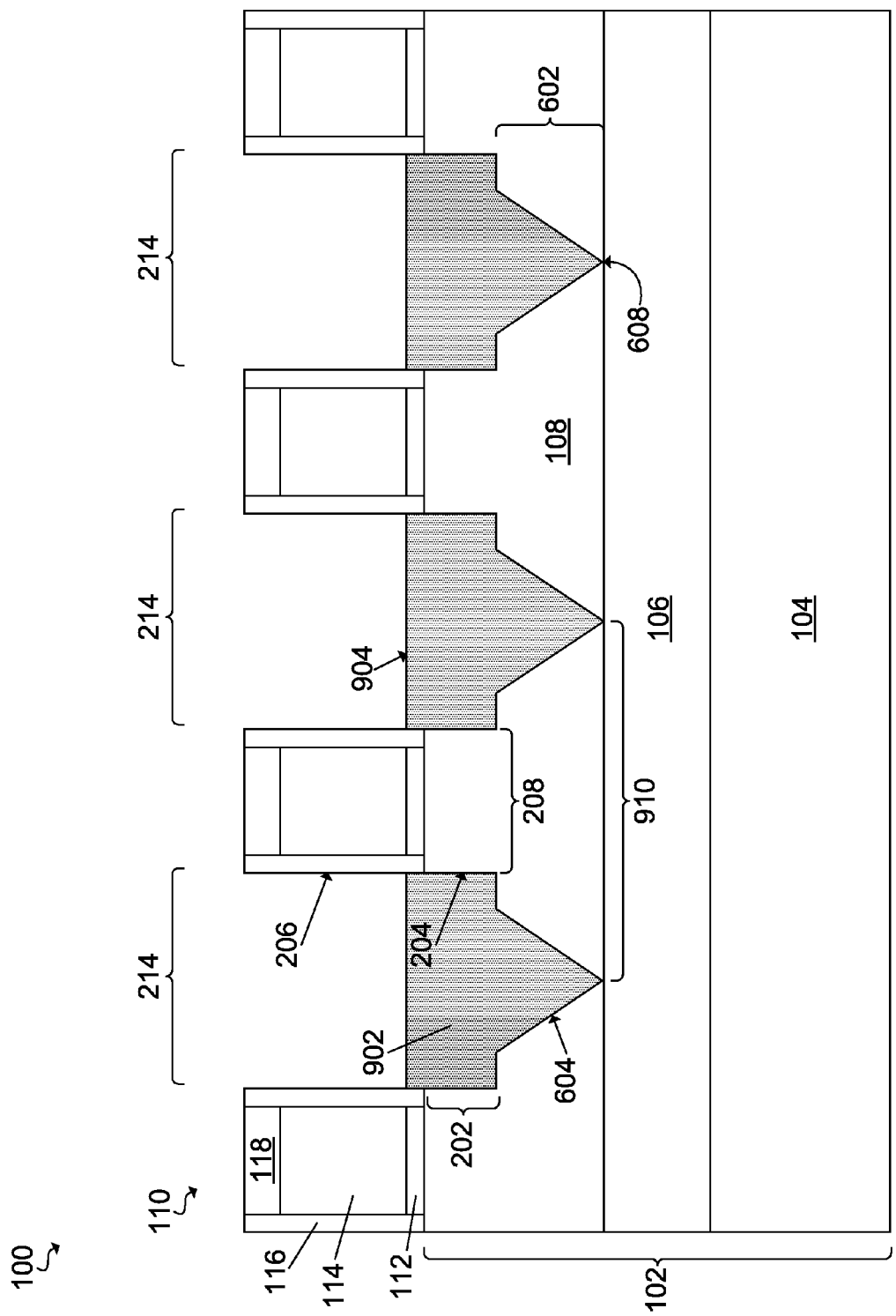
FIG. 9B is a cross section view forming a source-drain region having a pointed bottom in the nonuniform trench, according an embodiment of the present invention.

Referring now to FIG. 9B, a cross section view of another embodiment, wherein the bottom portion 602 may come to a point 608, rather than the horizontal bottom 606 (FIG. 6), is shown. The structure shown in FIG. 9B may be substantially similar to the structure shown in FIG. 9A and formed using substantially similar techniques as those described above with reference to FIGS. 1-9A; however, the etching process used to form the bottom portion 602 described above in detail with reference to FIG. 6 may be allowed to proceed to completion, thereby forming the point 608 that is adjacent to the isolation layer 106.

Although FIG. 9B shows the point 608 in contact with the isolation layer 106, embodiments are considered in which the point 608 is separated from the isolation layer 106 by a portion of the SOI layer 108. This technique, wherein a point 608 is formed, may be preferred in an embodiment in which the lateral spacing between gate stacks 110 is substantially uniform. This may result in the point 608 of each nonuniform trench 214 extending to an equal depth of the SOI layer 108. In an embodiment, parasitic back channel leakage into the base substrate 104 may be reduced because the length of an effective parasitic back channel 910 may be greater than the length of the effective channel 208. In addition, because of the shape of the S-D regions 902, the length of the effective parasitic back channel 910 may be greater than a conventional back channel length.

Another embodiment by which to form a non-uniform trench for junction butting is described below in detail with reference to FIGS. 10-14. In the present embodiment, a faceted trench and a buffer layer may be formed to reduce body-to-body leakage as well as backchannel leakage.

FIGS. 10-14 illustrate and describe stages in a fabrication process of a structure 200 in accordance with embodiments of the present invention Like above, each of the figures is a cross section view of a portion of a semiconductor substrate. Like the structure 100, the structure 200 may include gate stacks formed on a SOI substrate. Distinguishing aspects of the present embodiment are described in detail below.

Figure 10:
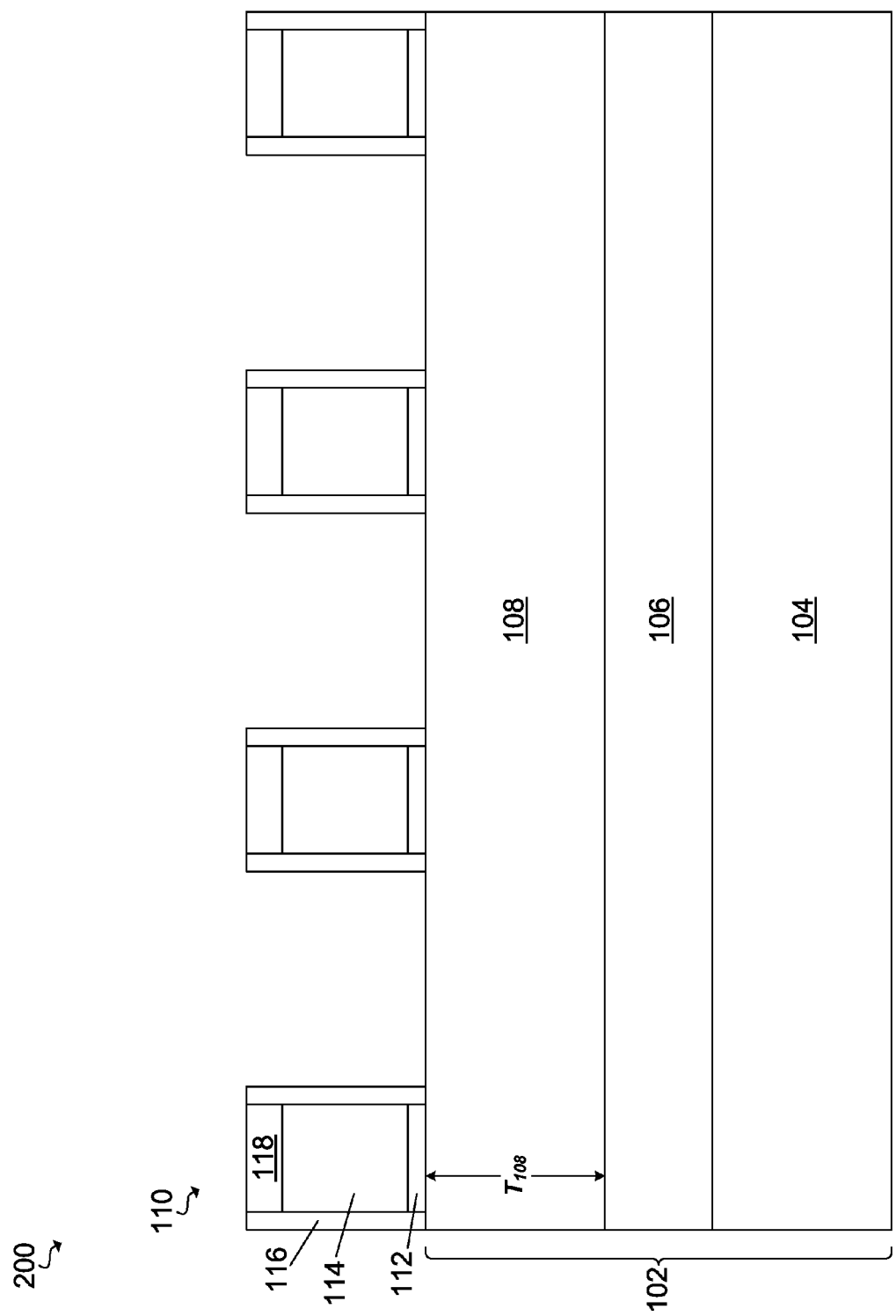
FIG. 10 is a cross section view illustrating a structure, according to an embodiment of the present invention.

Referring now to FIG. 10, a cross section view of the structure 200 is shown. Structure 200 may be substantially similar to the structure 100 and may be formed using substantially similar techniques as those described above with reference to FIG. 1.

Figure 11:
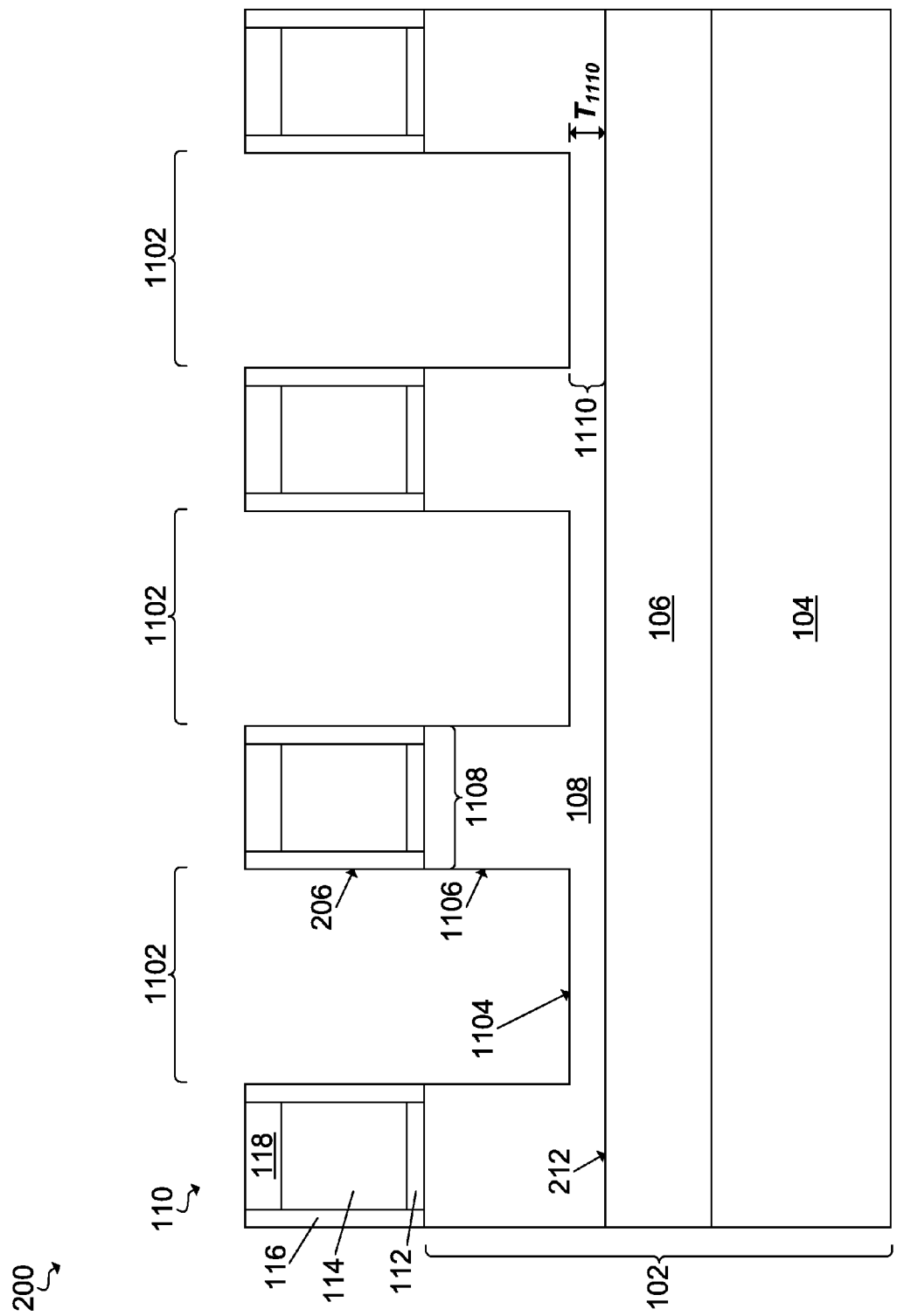
FIG. 11 is a cross section view illustrating forming a deep trench in the structure, according to an embodiment of the present invention.

Referring now to FIG. 11, a cross section view illustrating forming a deep trench 1102 in the SOI layer 108 between adjacent gate stacks 110 is shown. In an embodiment, the deep trench 1102 may be formed by anisotropically etching the SOI layer 108 using a conventional etching process, such as, for example, reactive ion etching (RIE). In an embodiment, the SOI layer 108 may be etched so that a bottom 1104 of the trench remains substantially horizontal (i.e., parallel with the upper surface 212 of the isolation layer 106). The gate spacer 116 may serve as an etch stop, preventing portions of the SOI layer 108 below the gate spacer 116 and the gate stack 110 from being removed. It should be noted that, unlike previous embodiments, trench liners, such as the first trench liner 302 (FIG. 3) and the second trench liner 402 (FIG. 4), are not used.

Accordingly, the deep trench 1102 may have a pair of sidewalls 1106 (hereinafter "sidewalls") that are substantially flush with the sidewall 206 of the gate spacers 116. It should be noted that this etching technique may provide for a larger effective channel 1108 (i.e., the width of the SOI layer 108 directly below the gate stack 110 and between a source region and a drain region) than conventional junction butting fabrication techniques. The deep trench 1102 may have a substantially rectangular profile. The deep trench 1102 may be formed so that a portion 1110 of the SOI layer 108 may remain below the deep trench 1102. The portion 1110 may have a thickness T$_{1110}$ ranging from approximately 5 nm to approximately 50 nm.

Figure 12:
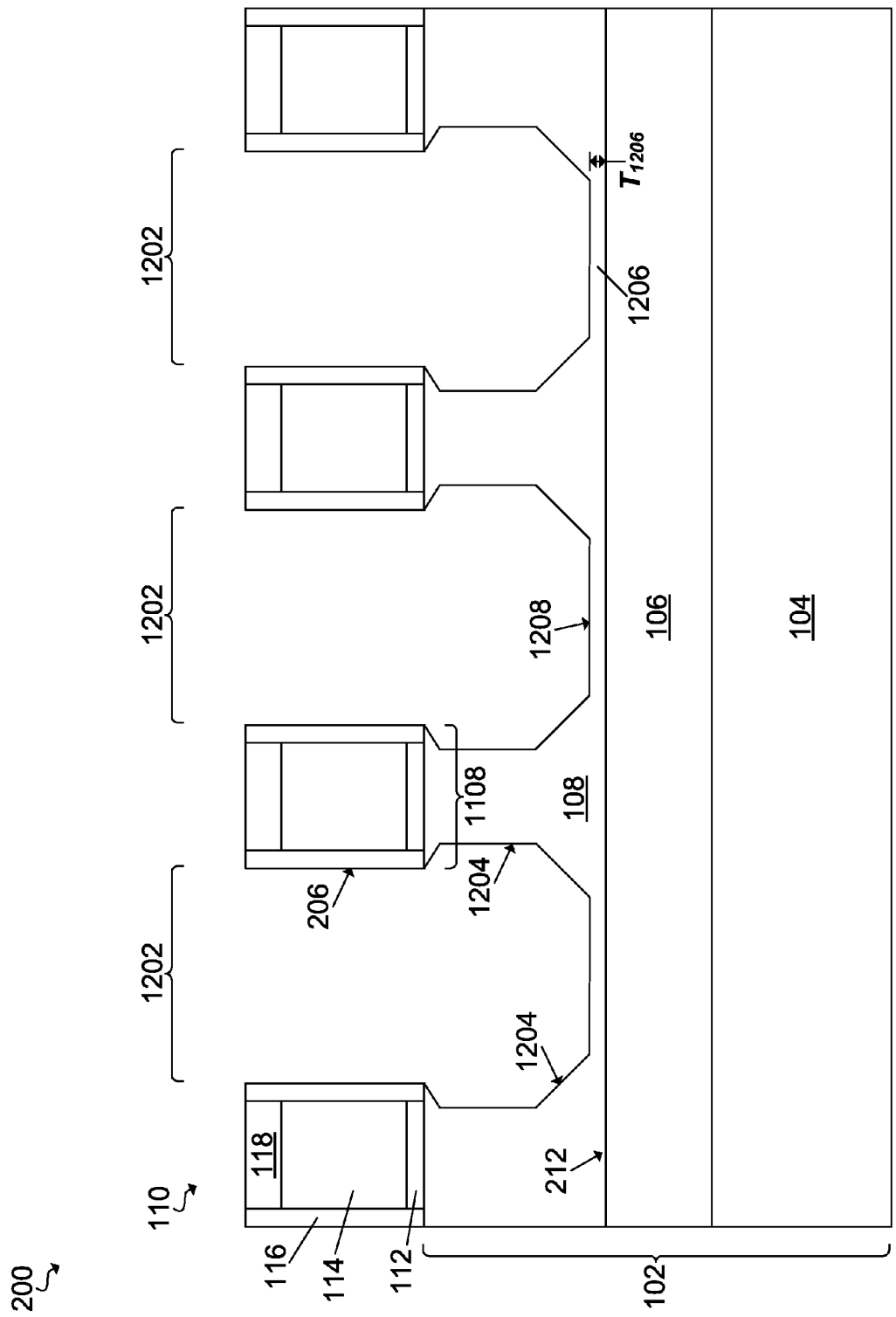
FIG. 12 is a cross section view illustrating forming a faceted trench in the deep trench, according to an embodiment of the present invention.

Referring now to FIG. 12, a cross section view illustrating forming a faceted trench 1202 by etching the SOI layer 108 exposed within the deep trench 1102 (FIG. 11) is shown. The faceted trench 1202 may be formed using a conventional anisotropic wet etch. The etchant may be chosen for its selectivity to the gate spacer 116. In an embodiment, the etchant may be ammonium hydroxide (NH$_4$OH). The etchant may etch the SOI layer 108 along the 1:1:1 crystallographic plane. Because of the width and the rectangular profile of the deep trench 1102, as well as the lack of the first trench liner 302 (FIG. 3) and the second trench liner 402 (FIG. 4), the etching process may result in the faceted trench 1202 having and angled shape with angled or faceted sidewalls 1204. The faceted trench 1202 may have a substantially flat bottom 1208 that is adjacent to the isolation layer 106.

In an embodiment, the faceted trench 1202 may have a substantially octagonal profile. A portion of the faceted sidewalls 1204 begin at the point at which the gate spacer 116 comes in contact with the SOI layer 108 and may angle under the gate stack 110. This portion of the faceted sidewalls 1204 may then meet a vertical portion of the faceted sidewalls 1204 that extends vertically below the gate stack 110. In other words, the width of the effective channel 1108 may be larger than the width of the remaining portion of the SOI layer 108 directly below the effective channel 1108. In addition, a portion 1206 of the SOI layer 108 may remain below the faceted trench 1202. The portion 1206 may have a thickness T$_{1206}$ ranging from approximately 2 nm to approximately 10 nm. Because of the wet etching process, the thickness T$_{1206}$ may be smaller than the thickness T$_{1110}$ (FIG. 11) above.

Figure 13:
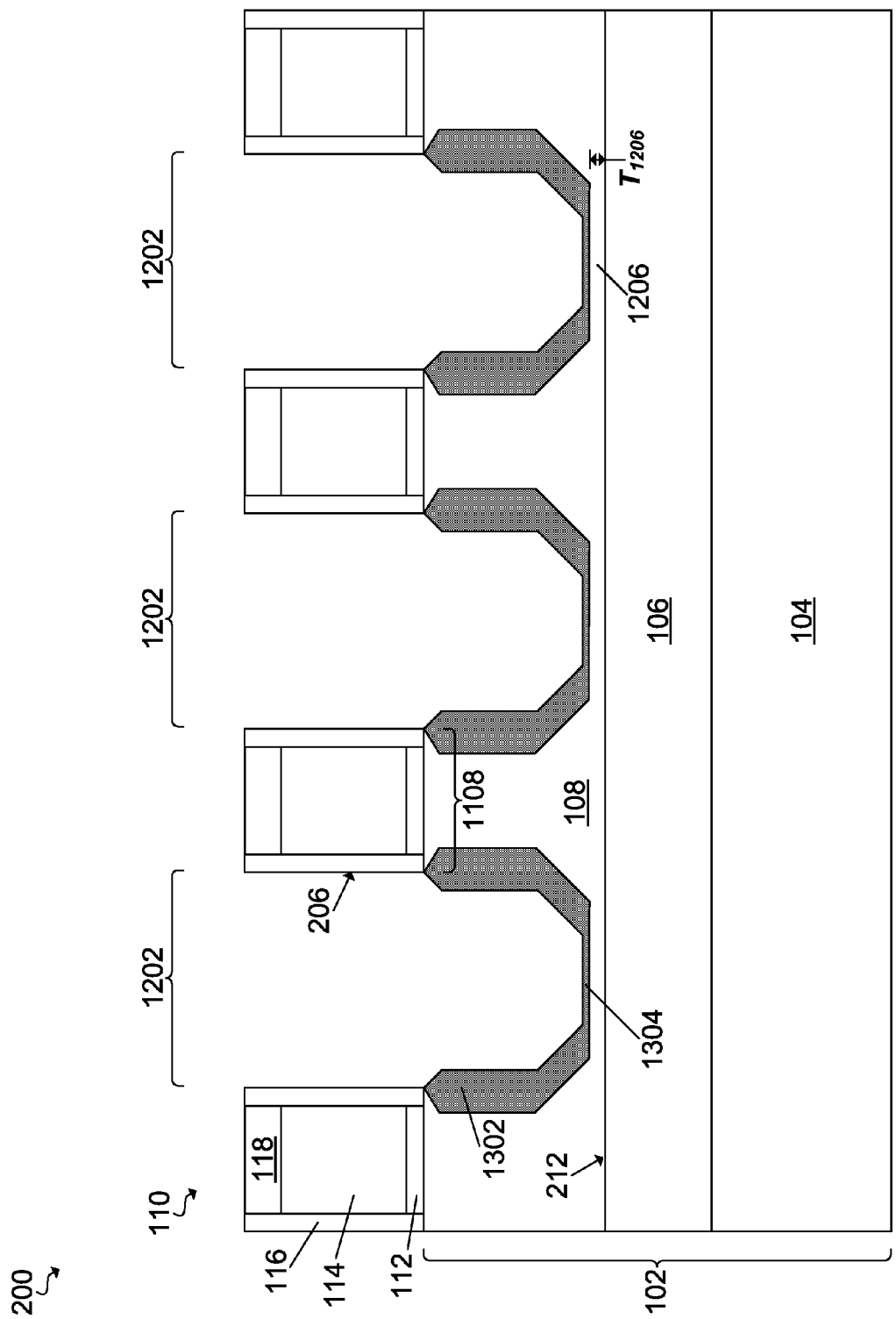
FIG. 13 is a cross section view illustrating forming a buffer layer in the faceted trench, according to an embodiment of the present invention.

Referring now to FIG. 13, a cross section view illustrating forming a buffer layer 1302 in the faceted trench 1202 is shown. The buffer layer 1302 may be deposited by a conventional conformal deposition process, such as, for example, CVD, PECVD, MOCVD, ALD, evaporation, reactive sputtering, chemical solution deposition, and other like processes. In an embodiment, a bottom portion 1304 of the buffer layer 1302 may be thinner than other portions of the buffer layer 1302.

The buffer layer 1302 may be composed of an undoped or lightly doped semiconductor material, such as, for example, Si, SiC, SiGe, or Ge. In an embodiment in which the structure 200 is a NFET, the buffer layer 1302 may be doped with n-type dopants, such as, for example phosphorus or arsenic doping. In an embodiment in which the structure 200 is a PFET, the buffer layer may be doped with p-type dopants, such as, for example, boron or boron difluoride. It should be noted that the dopant concentration in the buffer layer 1302 may be less than the dopant concentration in the subsequent S-D region formed on the buffer layer.

Figure 14:
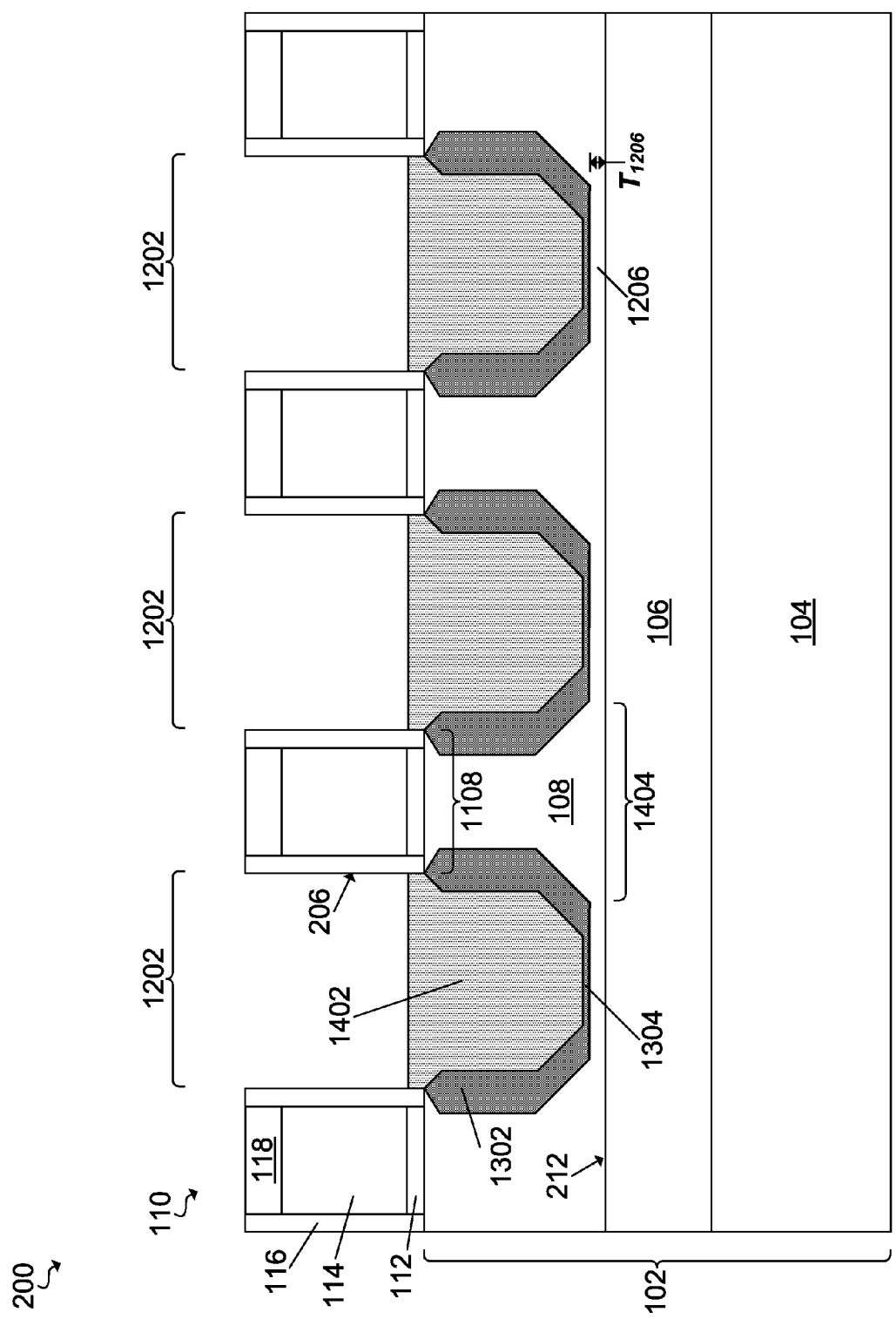
FIG. 14 is a cross section view illustrating forming a source-drain region on the buffer layer, according to an embodiment of the present invention.

Referring now to FIG. 14, a cross section view illustrating forming a source-drain region 1402 (hereinafter "S-D region") on the buffer layer 1302 in the faceted trench 1202 is shown. The S-D region 1402 may be substantially similar to the S-D region 902 (FIGS. 9A-9B) and may be formed using substantially similar techniques as those discussed above with reference to FIGS. 9A-9B. The S-D region 1402, together with the buffer layer 1302, may have a tapered bottom portion in close proximity to the isolation layer 106 that serves as a junction butting region to reduce body-to-body leakage between adjacent FETs. In an embodiment, parasitic back channel leakage into the base substrate 104 may be reduced because the length of an effective parasitic back channel 1404 may be greater than the length of the effective channel 1108. In addition, because of the shape of the S-D regions 1402, the length of the effective parasitic back channel 1404 may be greater than a conventional back channel length.

Embodiments of the present invention may allow for the fabrication of a junction butting region in a SOI layer between adjacent FETs using specific etching techniques to form a nonuniform trench and subsequent S-D region. The techniques described above may utilize the geometric shape of the nonuniform trench and S-D region to form a solidly butted junction instead of using ion implantation to dope regions of the SOI layer as in conventional techniques. This may provide an alternative to conventional ion implantation techniques, which may cause degraded short-channel effects as a result of lateral ion scattering during implantation. Embodiments of the present invention may leave the SOI layer under the gate dielectric and gate spacers substantially intact, without any dopant contamination from lateral ion scattering, resulting in a larger effective gate length than can be achieved with conventional ion implantation junction butting techniques. In addition, the tapered bottom of the nonuniform trench may result in less parasitic leakage between the S-D regions, because the effective channel length of the parasitic back channel FET has increased significantly, without degrading the front channel device short-channel characteristics.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A junction butting structure comprising:
a source-drain region in a silicon on insulator (SOI) layer between a first gate stack and a second gate stack, wherein the source-drain region includes:
an upper portion having a first concentration of dopants therein, and
a tapered bottom portion beneath the upper portion and adjacent to an underlying isolation layer, wherein the tapered bottom portion includes a second concentration of dopants that is less than the first concentration of dopants, such that the source-drain region includes a graded doping concentration from the upper portion to the tapered bottom portion, wherein an effective channel directly below the first gate stack has a width that is less than a width of an effective back channel directly above the isolation layer; and
a buffer layer located between the source-drain region and the SOI layer, wherein the buffer layer includes a first portion adjacent to the source-drain region and a second portion adjacent to a bottom surface of the source-drain region, wherein the first portion has a greater thickness than the second portion.

2. The junction butting structure of claim 1, wherein the tapered bottom portion has a substantially flat bottom that is separated from an upper surface of the isolation layer by a portion of the SOI layer.

3. The junction butting structure of claim 1, wherein the tapered bottom portion has a pointed bottom that is in direct contact with the upper surface of the isolation layer.

4. The junction butting structure of claim 1, wherein the upper portion of the source-drain region has a width that extends from a first gate spacer on the first gate stack to a second gate spacer on the second gate stack.

5. The junction butting structure of claim 1, wherein the tapered bottom portion of the source-drain region has a maximum width that is less than the width of the upper portion of the source-drain region.

6. The junction butting structure of claim 1, wherein the source-drain region comprises: a doped epitaxial semiconductor material.

7. A junction butting structure comprising:
a source-drain region in a silicon on insulator (SOI) layer between a first gate stack and a second gate stack, wherein the source-drain region includes:
an upper portion having a first concentration of dopants therein, and
a lower portion positioned beneath the upper portion, having angled sidewalls and a flat bottom portion that is adjacent to an underlying isolation layer, such that the source-drain region includes a graded doping concentration from the upper portion to the lower portion, wherein an effective channel directly below the first gate stack has a width that is less than a width of an effective back channel directly above the isolation layer; and
a buffer layer located between the source-drain region and the SOI layer, wherein the buffer includes a first portion adjacent to the angled sidewalls of the source-drain region and a second portion adjacent to the flat bottom of the source-drain region, wherein the first portion has a greater thickness than the second portion.

8. The junction butting structure of claim 7, wherein the buffer layer is separated from an upper layer surface of the isolation layer by a portion of the SOI layer.

9. The junction butting structure of claim 7, wherein the source-drain region comprises: a doped epitaxial semiconductor material.

10. The junction butting structure of claim 7, wherein the buffer layer comprises: a semiconductor material having a dopant concentration that is less than a dopant concentration of the source-drain region.

11. The junction butting structure of claim 7, wherein the angled sidewalls extend into a portion of the SOI layer below the first gate stack and a portion of the SOI layer below the second gate stack.

* * * * *